US012712033B2

(12) United States Patent
Lin et al.

(10) Patent No.: US 12,712,033 B2
(45) Date of Patent: Aug. 18, 2026

(54) DYNAMIC READ DISTURB HANDLING USING SELECTIVE SCANNING

(71) Applicant: Micron Technology, Inc., Boise, ID (US)

(72) Inventors: Lei Lin, Fremont, CA (US); Christina Papagianni, San Jose, CA (US); Guang Hu, Mountain View, CA (US); Murong Lang, San Jose, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 110 days.

(21) Appl. No.: 18/777,850

(22) Filed: Jul. 19, 2024

(65) Prior Publication Data

US 2026/0024594 A1 Jan. 22, 2026

(51) Int. Cl.
*G11C 11/34* (2006.01)
*G11C 16/08* (2006.01)
*G11C 16/34* (2006.01)

(52) U.S. Cl.
CPC .......... *G11C 16/3427* (2013.01); *G11C 16/08* (2013.01)

(58) Field of Classification Search
CPC ............................ G11C 16/3427; G11C 18/08
USPC ..................................................... 365/185.02
See application file for complete search history.

(56) References Cited

U.S. PATENT DOCUMENTS 8,504,897 B2 * 8/2013 Imagawa ............ G06F 11/1016 714/768
9,305,654 B2 * 4/2016 Parat .................. G11C 16/3409
9,583,201 B1 * 2/2017 Lee ........................ G11C 16/10
2009/0323412 A1 12/2009 Mokhlesi et al.
2010/0023800 A1 * 1/2010 Harari ................ G11C 16/0483 711/E12.008

(Continued)

FOREIGN PATENT DOCUMENTS

CN 102844746 A * 12/2012 ......... G11C 16/3418
JP 2009026285 A * 2/2009
KR 20220150147 A * 11/2022 ......... G11C 16/3459

OTHER PUBLICATIONS

Y. Cai et al, “Read Disturb Errors in MLC NAND Flash Memory: Characterization, Mitigation, and Recovery,” 2015 45th Annual IEEE/IFIP International Conference on Dependable Systems and Networks, Rio de Janeiro, Brazil, 2015, pp. 438-449. https://ieeexplore.ieee.org/document/7266871 (Year: 2015).*

(Continued)

*Primary Examiner* — Viet Q Nguyen
(74) *Attorney, Agent, or Firm* — NICHOLSON DE VOS WEBSTER & ELLIOTT LLP

(57) ABSTRACT

Exemplary methods, apparatuses, and systems including a scan manager for dynamic read disturb handling using selective scanning. The scan manager reads a list of wordlines to be scanned during a read disturb handling of a memory device. The memory device has separately accessible blocks of memory where each block of memory has a plurality of wordlines used to address a plurality of pages. Each block of memory is divided into a plurality of sub-blocks. The scan manager randomly selects a sub-block from the plurality of sub-blocks of a block of memory. The scan manager scans a page of the plurality of pages of a wordline from the list of wordlines of the selected sub-block during the read disturb handling.

20 Claims, 6 Drawing Sheets

(56) References Cited

U.S. PATENT DOCUMENTS

| | | | | |
|---|---|---|---|---|
| 2010/0157671 | A1* | 6/2010 | Mokhlesi | G11C 16/3418 365/185.11 |
| 2011/0040924 | A1* | 2/2011 | Selinger | G06F 11/1004 711/E12.008 |
| 2015/0039842 | A1 | 2/2015 | Fitzpatrick et al. | |
| 2015/0221387 | A1 | 8/2015 | Nam | |
| 2019/0103164 | A1* | 4/2019 | Malshe | G11C 29/021 |
| 2022/0115079 | A1 | 4/2022 | Sheperek et al. | |
| 2022/0391102 | A1* | 12/2022 | Rayaprolu | G11C 29/32 |
| 2024/0029802 | A1 | 1/2024 | Zhou et al. | |
| 2024/0054070 | A1* | 2/2024 | Tan | G11C 16/26 |
| 2024/0071554 | A1* | 2/2024 | Hu | G11C 29/023 |
| 2024/0161828 | A1* | 5/2024 | Yang | G11C 11/5635 |
| 2024/0427500 | A1* | 12/2024 | Ciocchini | G06F 3/0679 |
| 2025/0355800 | A1* | 11/2025 | Papagianni | G06F 12/0246 |

OTHER PUBLICATIONS

International Search Report and Written Opinion, PCT App. No. PCT/US2025/037944, Nov. 13, 2025, 09 pages.

* cited by examiner

600
PROCESSING DEVICE
602
INSTRUCTIONS
626
SCAN MANAGER
113
STATIC MEMORY
606
BUS 630
MAIN MEMORY
604
INSTRUCTIONS
626
SCAN MANAGER
113
DATA STORAGE SYSTEM
618
MACHINE-READABLE MEDIUM
624
INSTRUCTIONS
626
SCAN MANAGER
113
NETWORK
INTERFACE DEVICE
608
NETWORK
620

DYNAMIC READ DISTURB HANDLING USING SELECTIVE SCANNING

TECHNICAL FIELD

The present disclosure generally relates to dynamic read disturb handling, and more specifically, relates to selective scanning during read disturb handling.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
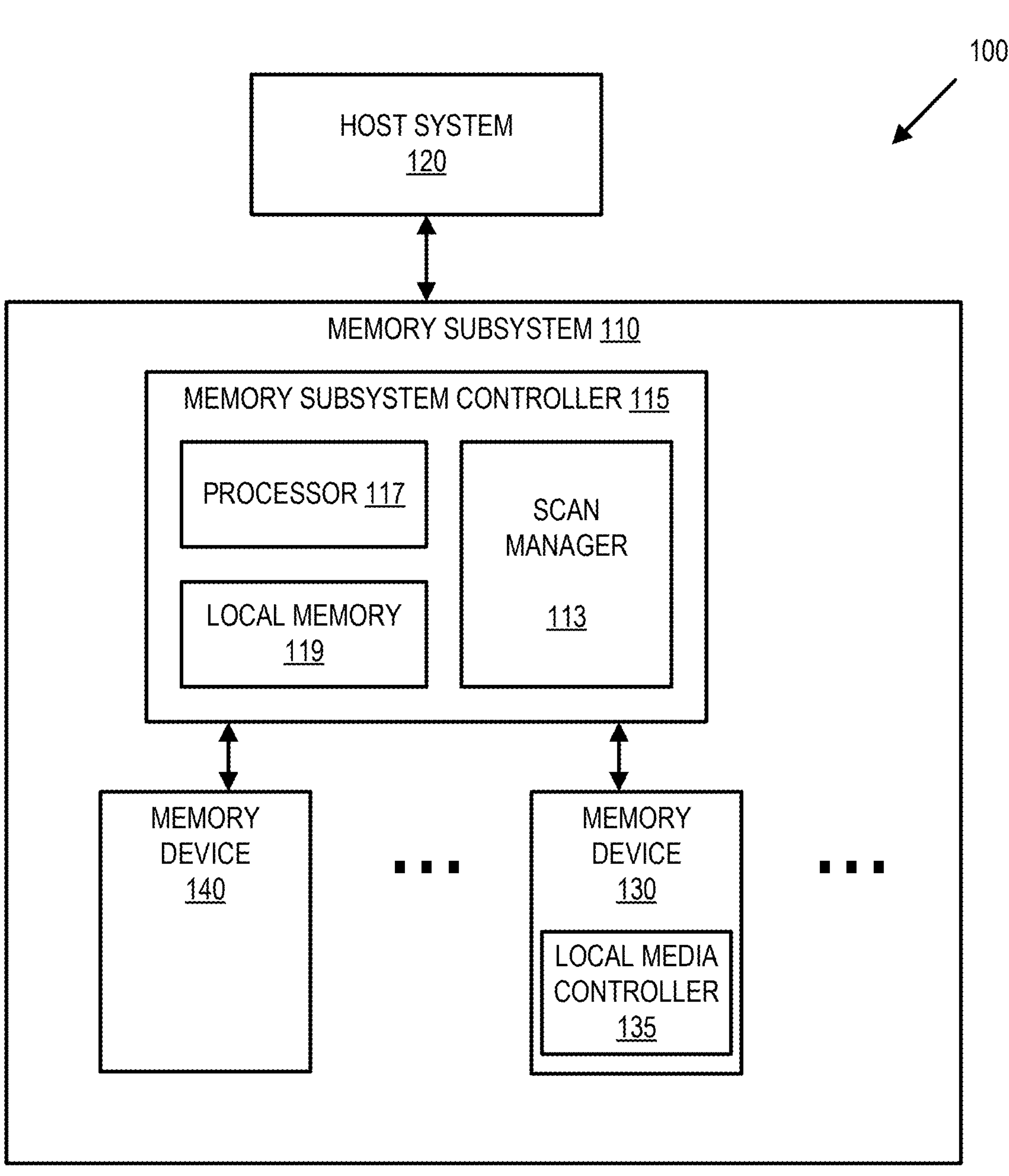
FIG. 1 illustrates an example computing system that includes a memory subsystem in accordance with some embodiments of the present disclosure.

Aspects of the present disclosure are directed to dynamic read disturb handling using selecting scanning in a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information. Memory cells in a block are addressed using a bitline and a wordline. Pages of a block include a set of memory cells that share a single wordline. Each block can also be divided into a number of sub-blocks. For example, each set of physical blocks in a plane of a NAND memory device can be partitioned into four sub-blocks (e.g., SB0, SB1, SB2, and SB3) that include a number of pages, each page being addressable using a wordline and a bitline. The number of pages in each sub-block may be the same or different such that the sub-blocks of the block are the same size or different sizes.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), quad-level cells (QLCs), and penta-level cells (PLCs). For example, an SLC can store one bit of information and has two logic states while a QLC can store sixteen bits of information and has sixteen logic states.

Reliability is an example of a health indicator for a memory device. Reliability refers to the extent to which a memory device is capable of correctly reading data that has been previously written to the memory device. Reduced reliability of a memory device can result from a disturbance known as read disturb. A read disturb error occurs when a read operation on a portion of memory (e.g., cells of a first page of a block) impacts the threshold voltages of unread memory cells in a different portion of memory (e.g., cells of a second page of the same block). Memory devices typically have a finite tolerance for these disturbances. A sufficient amount of read disturb effects can shift the threshold voltages of the unread cells to different logical states than the originally programmed states, which can cause read errors.

Read disturb handling (RDH) is a process used to identify the risk of data loss caused by read disturb errors. In operation, a read bit error rate (RBER) is computed for a portion of memory that is scanned during the RDH process. For example, a high RBER computed for a portion of memory represents a high risk of data loss for that portion of memory. Similarly, a low RBER computed for a portion of memory represents a low risk of data loss for that portion of memory. If the RBER for the portion of memory satisfies a threshold RBER, then the entire block is refreshed to mitigate the read disturb effects. Refreshing the block includes re-reading and re-writing the data in the block to preserve the originally programmed states of the data.

Instead of scanning each sub-block, page, and/or wordline of a block to determine the RBER for the corresponding sub-block, page, and/or wordline, conventional systems scan one or more predetermined wordlines of a predetermined sub-block. The selected sub-block, page, and/or wordline is critical in that the RBER for the selected sub-block, page, and/or represents the risk of data loss for the entire block. Conventional systems that scan a predetermined sub-block, however, risk the possibility that other sub-blocks of the block may have a different RBER than the predetermined sub-block. For example, conventional systems assume the predetermined sub-block has the highest RBER. As a result, such conventional systems can determine that the block does not need to be refreshed despite this assumption being incorrect and other sub-blocks exhibiting higher RBER.

Additionally, conventional systems scan a predetermined page of the predetermined sub-block for the RBER computation. For example, in a TLC consisting of a lower page, upper page, and extra page, conventional systems determine the RBER of wordlines only of the lower page, assuming the lower page exhibits the highest RBER. However, there can be page-based RBER variation. As a result, selecting the lower page of the TLC to perform the RBER computation, may not necessarily yield the highest RBER as compared to the RBERs of the extra page and the upper page. Accordingly, the predetermined selection of the page does not necessarily further the effort of identifying the page that will yield the highest RBER.

Aspects of the present disclosure address the above and other deficiencies by dynamically selecting wordlines, pages, and/or sub-blocks to be scanned during an RDH process. Dynamically selecting wordlines, pages, and/or sub-blocks improves the accuracy of determining the likelihood of data loss during the RDH process. For example, a random selection of sub-blocks from a set of sub-blocks increases the likelihood of scanning a portion of memory having the highest or better representative RBER value, improving RDH precision. Similarly, dynamically scanning pages increases the reach of RDH processes by scanning pages that would not have previously been scanned in conventional systems. In addition, aspects of the present disclosure map wordlines to pages to account for page-based RBER variation. Lastly, aspects of the present disclosure can select wordlines and pages to be scanned using the temperature of the memory device. As a result, RDH process time is reduced by omitting wordlines and pages that may be otherwise scanned during RDH processes of conventional systems FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes a scan manager 113 that can dynamically select pages, sub-blocks, and/or wordlines using sub-block dependence patterns, temperature, and/or read frequency. In some embodiments, the controller 115 includes at least a portion of the scan manager 113. For example, the controller 115 can include a processor 117 (processing device) configured to execute instructions stored in local memory 119 for performing the operations described herein. In some embodiments, a scan manager 113 is part of the host system 120, an application, or an operating system.

The scan manager 113 can selectively scan wordlines, pages, and/or sub-blocks to perform a dynamic RDH. The dynamic selection of wordlines, pages, and/or sub-blocks improves the accuracy of the RDH processes. For example, performing RDH processes using a predetermined wordline, sub-block, and/or page, can result in using RBER values that poorly represent the reliability of the entire block. Dynamic selection of wordlines, pages, and/or sub-blocks increases the accuracy of the RDH of the block by scanning a broader range of sub-blocks, pages, and/or wordlines, without adding any additional latency. Further details with regard to the operations of the scan manager 113 are described below.

Figure 2:
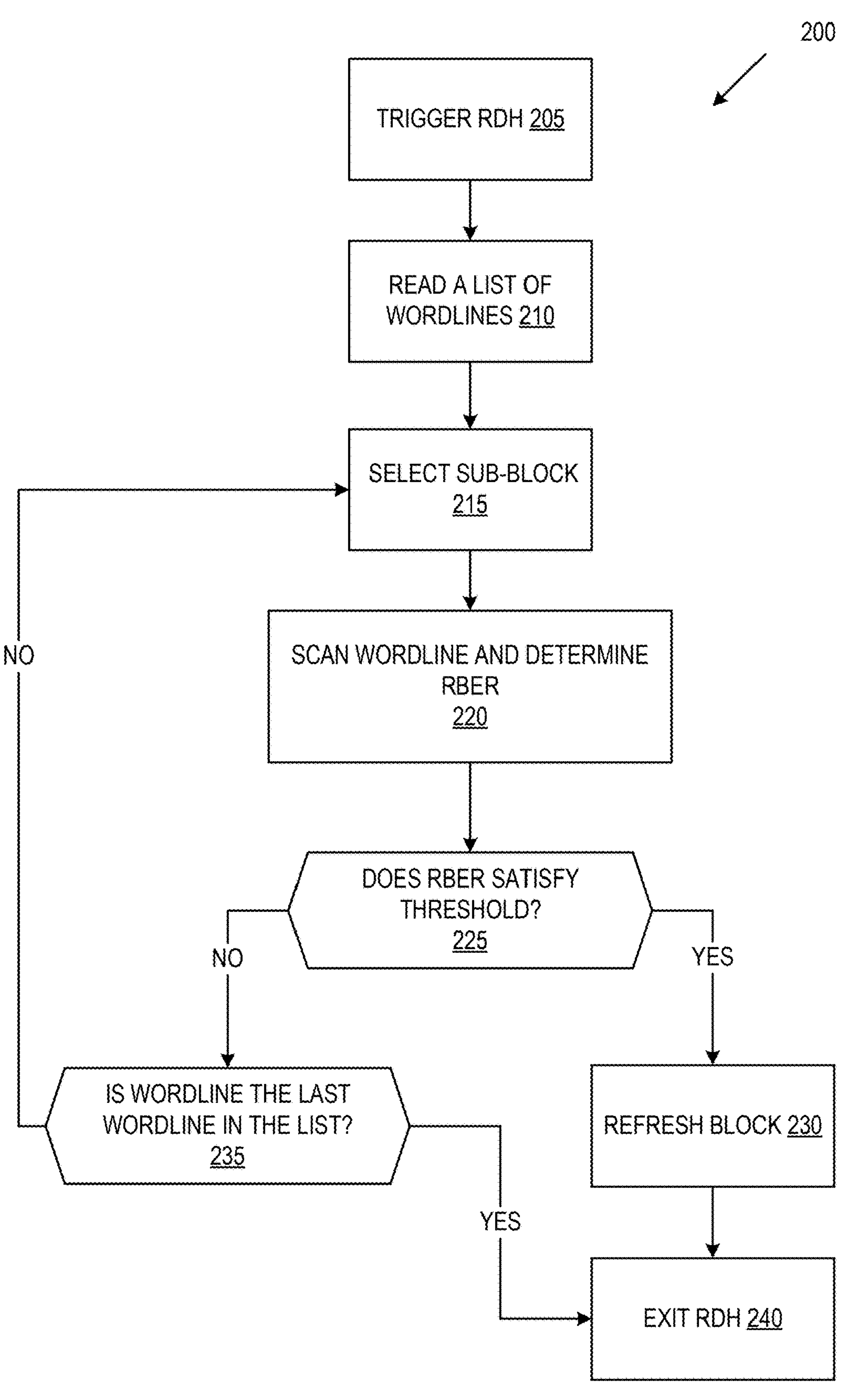
FIG. 2 is a flow diagram of an example method to perform dynamic sub-block selections during read disturb handling processes, in accordance with some embodiments of the present disclosure.

FIG. 2 is a flow diagram of an example method 200 to perform dynamic sub-block selections during RDH processes, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the scan manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 205, the processing device triggers RDH to evaluate the reliability of a memory device. RDH processes can be triggered a number of ways. For example, the scan manager 113 can determine that a number of read operations performed on pages, wordlines, or sub-blocks of a block of the memory device satisfies a read count threshold. In some embodiments, the scan manager 113 tracks each read operation performed on a page, wordline, and/or sub-block of a block and increments a counter. When the value of the counter satisfies the read count threshold, RDH is triggered. Alternatively, the scan manager 113 triggers RDH in response to a threshold amount of time passing since the last RDH process, memory activity (or lack thereof) satisfying a threshold level, etc.

In one embodiment, the timing requirements for performing RDH can differ depending on the origin of the read command. For example, a read command originating from the memory subsystem can trigger a background RDH with less stringent latency requirements than the latency requirements of a foreground RDH. A foreground RDH is a RDH that is triggered responsive to a read command originating from the host system while a background RDH is triggered responsive to a read command originating from the memory subsystem, e.g., when performing an internal operation such as garbage collection.

If the RDH is a background RDH, because the timing requirements for performing RDH are less stringent, more than one sub-block can be selected by the scan manager 113 at operation 215. For example, if the RDH is a background RDH, at operation 215, the scan manager 113 can select two sub-blocks to be scanned during a single iteration of the background RDH. Similarly, if the RDH is a background RDH, at operation 215, the scan manager 113 can select two wordlines to be scanned during a single iteration of the background RDH. In contrast, if the RDH is a foreground RDH, then to comply with more stringent latency requirements, the scan manager 113 selects a single sub-block to be scanned at operation 215.

At operation 210, the processing device reads a list of wordlines to be scanned during RDH. The list of wordlines includes multiple wordlines. Both the wordlines and the number of wordlines in the list of wordlines can be parameters that are based on the requirements of a particular design or implementation of the memory device or the computing system, for example as the result of experimentation or operational testing.

In some embodiments, the scan manager 113 modifies the wordline list. For example, the scan manager 113 can capture a frequency of read commands when the RDH is triggered at operation 205. The scan manager 113 can time stamp read commands and divide two read commands by the difference in time between the two read commands. If the frequency of read commands satisfies a frequency threshold, then the scan manager 113 can modify the wordline list. In one embodiment, the scan manager 113 modifies the wordline list by adding wordlines to the wordline list to be scanned during RDH. For example, if the memory subsystem 110 executes read commands at a high frequency and the read count threshold is satisfied, (triggering RDH), the scan manager 113 can increase the number of wordlines to be scanned during RDH. In some embodiments, wordlines added to the wordline list are predetermined. For example, wordlines added to the list can be additional parameters that are based on the requirements of a particular design or implementation of the memory device or the computing system, for example as the result of experimentation or operational testing.

In contrast, if the memory subsystem 110 executes read commands at a low frequency and RDH is triggered, then scan manager 113 can decrease wordlines to be scanned during RDH. For example, the scan manager 113 can remove wordlines from the wordline list such that fewer wordlines are scanned during RDH. In some embodiments, wordlines removed from the wordline list are predetermined. For example, wordlines removed from the list can be additional parameters that are based on the requirements of a particular design or implementation of the memory device or the computing system, for example as the result of experimentation or operational testing.

At operation 215, the processing device selects a sub-block to be evaluated for RDH. For example, a block of NAND can be partitioned into four sub-blocks, SB0, SB1, SB2, and SB3. In other implementations, the block of NAND is partitioned into a different number of sub-blocks, e.g., six sub-blocks SB0-SB5. In some embodiments, the scan manager 113 randomly selects a sub-block. For example, for N sub-blocks, the scan manager 113 can generate a random integer between 0 and N−1 and select the sub-block to be scanned according to the corresponding generated random integer.

In other embodiments, the scan manager 113 selects a sub-block according to a predetermined sequence. For example, given a block partitioned into six sub-blocks, during a first iteration of method 200, the first sub-block selected for scanning by the scan manager 113 is SB1, during a second iteration of method 200, the second sub-block selected for scanning by the scan manager 113 is SB5, during a third iteration of method 300, the third sub-block selected for scanning by the scan manager 113 is SB3, and so on. As a result, each time RDH is triggered, the same predetermined sequence of sub-blocks is scanned.

At operation 220, the processing device scans a wordline of the selected sub-block from a list of wordlines. Scanning the wordline includes reading one or more codewords from the wordline by applying a charge to the wordline. The processing device determines the RBER of the codeword read from the wordline. The processing device can perform any one or more error correcting code (ECC) operations to determine the RBER of the codeword read from the wordline. For example, the codeword is encoded data that was written to the wordline using redundant ECC data (e.g., parity bits). The scan manager 113 decodes the codeword (e.g., with an ECC decoder) to obtain stored data. The redundant data is leveraged to correct any changes relative to the data as it was intended to be stored. The number of bit changes is used to determine the RBER.

At operation 225, the processing device determines whether the RBER of the codeword scanned from the wordline satisfies a RBER threshold. The RBER threshold can be a parameter that is based on the requirements of a particular design or implementation of the memory device or the computing system, for example as the result of experimentation or operational testing. If the RBER of the codeword satisfies the RBER threshold (e.g., the RBER corresponding to the wordline of a block meets or exceeds a RBER threshold), then the flow of operations moves to operation 230. If the RBER of the codeword does not satisfy the RBER threshold (e.g., the RBER corresponding to the wordline does not meet or exceed the RBER threshold), then the flow of operations moves to operation 235.

At operation 230, the processing device refreshes the block. Refreshing the block includes the processing device reading the data from the block, correcting for bit errors in the read data to produce corrected data, and writing the corrected data to the same block and/or a different block.

At operation 240, RDH is complete. In other words, the evaluation of the risk of data loss of a block due to read disturb effects is completed for the block.

At operation 235, the processing device determines whether the scanned wordline is the last wordline in the list of wordlines. If the wordline is the last wordline in the list of wordlines, then the flow of operations moves to operation 240 and RDH is completed. If the wordline is not the last wordline in the list of wordlines (e.g., there are other wordlines in the list of wordlines to be scanned), then the flow of operations moves to operation 215 for a next iteration of method 200 of dynamic sub-block selection of RDH processes.

In a non-limiting example, method 200 begins and RDH is triggered at operation 205. In the example, the block for which RDH is triggered has four sub-blocks (e.g., SB0-SB3). At operation 210, the scan manager 113 reads a list of wordlines. In the example, the list of wordlines to be scanned during RDH is a predetermined wordline list that includes two wordlines (e.g., WLA and WLB). At operation 215, the scan manager 113 selects a sub-block from the range of sub-blocks SB0-SB3. For example, the scan manager 113 generates a random integer between zero and three and selects the sub-block corresponding to the random integer. In the above example, SB2 is randomly selected. At operation 220, the first wordline in the list of wordlines is scanned (e.g., WLA) at the selected sub-block (e.g., SB2). The RBER is determined for the codeword received from WLA at SB2. At operation 225, the scan manager 113 determines that the RBER corresponding to the codeword obtained from WLA at SB2 does not satisfy the RBER threshold such that the flow of operations continues to operation 235. At operation 235, the scan manager 113 determines that WLA (e.g., the first wordline) is not the last wordline (e.g., WLB) of the list of two wordlines.

Accordingly, a next iteration of method 200 of dynamic sub-block selection during RDH processes is performed. For example, the scan manager 113 randomly selects another sub-block from the range of sub-blocks SB0-SB3 at operation 215. For example, SB1 is randomly selected. At operation 220, the second wordline in the list of wordlines is scanned (e.g., WLB) at the selected sub-block (e.g., SB1). The scan manager 113 determines the RBER corresponding to the codeword obtained from WLB at SB1. At operation 225, the scan manager 113 determines that the RBER corresponding to the codeword obtained from WLB at SB1 does not satisfy the RBER threshold such that the flow of operations continues to operation 235. At operation 235, the scan manager 113 determines that WLB (e.g., the second wordline) is the last wordline in the list of two wordlines (e.g., WLA and WLB). Accordingly, RDH is complete at operation 240.

In some embodiments, operations 210-240 can be repeated for each block of a memory device during RDH.

Figure 3:
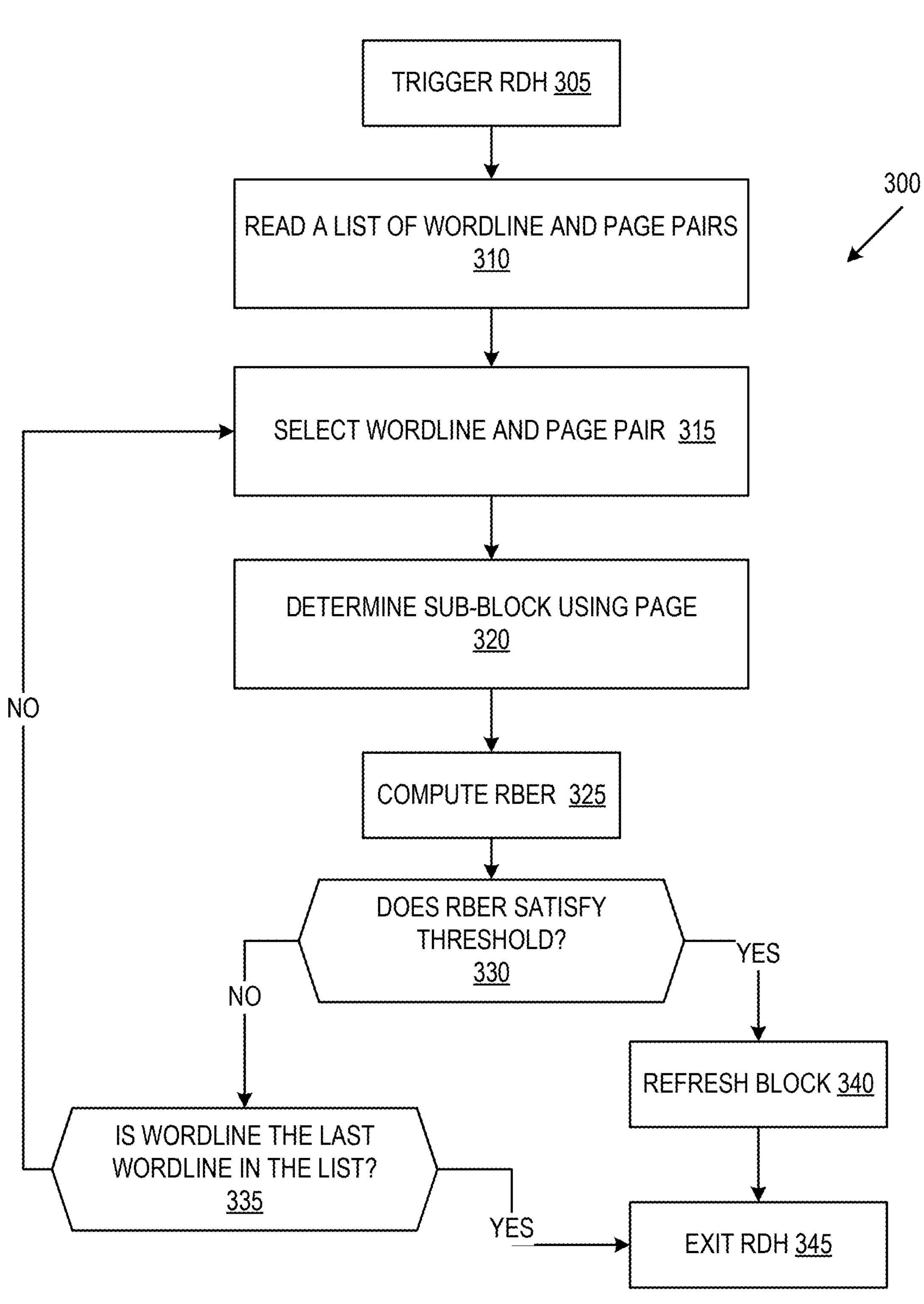
FIG. 3 is a flow diagram of an example method to perform dynamic wordline, page, and sub-block selection during read disturb handling processes, in accordance with some embodiments of the present disclosure.

FIG. 3 is a flow diagram of an example method 300 to perform dynamic wordline, page, and sub-block selection during RDH processes, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the scan manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Similar to the description above with reference to operation 205 of FIG. 2, the processing device triggers RDH at operation 305. For example, the scan manager 113 can determine that a number of read operations performed on pages, wordlines, or sub-blocks of a block satisfies a read count threshold and/or a threshold amount of time has passed since the last RDH process. As described above with reference to operation 205 of FIG. 2, if the read command that triggered RDH originates from the host system, a foreground RDH is triggered. As a result of the more stringent latency requirements associated with a foreground RDH, a single page, wordline, and sub-block is selected for scanning during RDH processes described at operations 315 and 320 respectively. In contrast, if the RDH is a background RDH process (e.g., the read command that triggered RDH originates from the memory subsystem 110), then more than one page, wordline, and/or sub-block can be selected for scanning during RDH processes described at operation 315 and/or operation 320 respectively.

At operation 310, the processing device reads a list of wordline and page pairs. The list of wordline and page pairs maps pages to wordlines to be scanned. In some embodiments, the pages and corresponding wordlines (e.g., the wordline and page pair) are predetermined. For example, each wordline and page pair can be a parameter that is based on the requirements of a particular design or implementation of the memory device or the computing system, for example as the result of experimentation or operational testing.

In some embodiments, the list of wordline and page pairs is a table and the first row of the table indicates wordlines to be scanned during RDH and the second row of the table maps pages to wordlines to be scanned during RDH. An example of a wordline and page pair list for a TLC including an upper page (UP), a lower page (LP), and an extra page (XP) is shown below in Table 1. As shown in Table 1 below, wordlines WLA, WLB, WLC, and WLD are paired with pages LP and XP, mapping the page to a wordline scanned during the RDH process.

TABLE 1

| Wordline List | | | | |
|---|---|---|---|---|
| Wordline | WLA | WLB | WLC | WLD |
| Page | LP | LP | XP | XP |

Similar to the description above with reference to operation 210 of FIG. 2, the scan manager 113 can modify the list of wordline and page pairs using the frequency of read commands. For example, the scan manager 113 can add or remove a number of wordline and page pairs from the list of wordline and page pairs responsive to the frequency of read commands. In some embodiments, the added or removed wordlines and corresponding pages are predetermined. For example, the added or removed wordlines and corresponding pages can be additional parameters that are based on the requirements of a particular design or implementation of the memory device or the computing system, for example as the result of experimentation or operational testing.

At operation 315, the processing device sequentially selects a wordline and page pair from the list of wordline and page pairs to be scanned during RDH. For example, during a first iteration of method 300 used to perform dynamic wordline, page, and sub-block selection during RDH processes, the first wordline and page pair of the list of wordline and page pairs is selected. During the second iteration of method 300, the second wordline and page pair of the list of wordline and page pairs is selected.

At operation 320, the processing device determines a sub-block to be scanned using the page of the wordline and page pair. For example, the scan manager 113 randomly selects a sub-block from a set of sub-blocks (or a subset of sub-blocks) corresponding to the page of the wordline and page pair. The set of sub-blocks (or subset of sub-blocks) that correspond to the page is determined using a sub-block dependence pattern. Different pages have different sub-block dependence patterns such that pages correspond to different sets of sub-blocks. The sub-block dependence pattern can be a parameter that is based on the requirements of a particular design or implementation of the memory device or the computing system, for example as the result of experimentation or operational testing. For example, inner sub-blocks of a block are selected when an extra page of a TLC is scanned. Accordingly, given SB0-SB3, SB1 and SB2 are a set of sub-blocks that correspond to the extra page of the TLC. When sub-blocks are dependent on the page, the RBER of a codeword read from a sub-block selected from the set of dependent sub-blocks is the representative RBER of the dependent set of sub-blocks. As a result, when an extra page of a TLC is to be scanned (e.g., according to the list of wordline and page pairs read at operation 310), then the set of sub-blocks that the scan manager 113 selects from is the set of dependent sub-blocks (e.g., inner sub-blocks such as SB1 and SB2).

In a non-limiting example, given four sub-blocks (e.g., SB0-SB3) of a TLC, if the page selected at operation 315 is a lower page, the scan manager randomly generates an integer between 0 and 3. As a result, the first range of integers (e.g., 0-3) represents the complete set of sub-blocks SB0-SB3 of the TLC. If the page selected at operation 315 is an extra page, then the scan manager 113 randomly generates an integer between 1 and 2. As a result, the second range of integers (e.g., 1-2) represents the set of inner sub-blocks (e.g., SB1 and SB2) of the TLC, where the set of inner sub-blocks are determined from the sub-block dependence pattern.

Operations 325-345 are similar to the description above with reference to operations 220-240 of FIG. 2. For example, at operation 325, the processing device computes the RBER of the wordline at the page of the sub-block. For example, the scan manager 113 can decode the codeword to identify the number of changed bits. At operation 330, the processing device determines whether the RBER satisfies a RBER threshold. If the RBER satisfies the RBER threshold (e.g., the RBER corresponding to the wordline of the page of the sub-block meets or exceeds a RBER threshold), then the flow of operations moves to operation 340. If the RBER does not satisfy the RBER threshold (e.g., the RBER corresponding to the wordline of the page of the sub-block does not meet or exceed a RBER threshold), then the flow of operations moves to operation 335. At operation 340, the processing device refreshes the block and at operation 345, the RDH process is complete. At operation 335, the processing device determines whether the scanned wordline is the last wordline in the list of wordlines (e.g., the wordline and page pair list). If the wordline is the last wordline, then the flow of operations moves to operation 345 and the RDH process is complete. If the wordline is not the last wordline (e.g., there are other wordlines in the wordline and page pair list to be scanned), then the flow of operations moves to operation 315 for a next iteration of method 300 used to perform dynamic wordline, page, and sub-block selection during RDH.

In a non-limiting example, method 300 begins and RDH is triggered at operation 305. The block for which RDH is triggered has four sub-blocks. At operation 310, the scan manager 113 reads a list of wordline and page pairs. An example wordline and page pair list is shown in Table 1, reproduced below.

TABLE 1

| Wordline List | | | | |
|---|---|---|---|---|
| Wordline | WLA | WLB | WLC | WLD |
| Page | LP | LP | XP | XP |

As shown in Table 1, wordlines are paired with pages to be scanned. At operation 315, the scan manager 113 sequentially selects a wordline from the list of wordline and page pairs shown in Table 1 above. For example, during a first iteration the scan manager 113 selects the first wordline WLA and corresponding page LP, during a second iteration, the scan manager 113 selects WLB and corresponding page LP, during a third iteration, the scan manager 113 selects WLC and corresponding page XP, and so on.

At operation 320, the scan manager 113 determines a sub-block to be scanned using the page of the wordline and page pair. The set of sub-blocks from which the sub-block is selected depends on the page of the wordline and page pair because different pages have different sub-block dependence patterns. Accordingly, during the first iteration, where the scan manager 113 has selected WLA to be scanned on LP, the scan manager 113 selects a random integer between 0-3 representing the set of sub-blocks SB0-SB3 to be scanned. For example, the scan manager 113 can generate a random integer 0, representing that SB0 is to be scanned. However, during the third iteration, where the scan manager 113 has selected WLC to be scanned on the XP, the scan manager 113 selects a random integer between 1-2 representing the set of inner sub-blocks SB1-SB2 to be scanned. This is because the set of sub-blocks from which the sub-block is selected given an XP is different from the set of sub-blocks from which the sub-block is selected given a LP due to the sub-block dependence pattern determined from XP of TLC.

At operation 325, the current wordline in the list of wordlines is scanned (e.g., WLA) at the selected sub-block (e.g., SB0) at the lower page (e.g., LP). The RBER is determined for one or more codewords of, e.g., WLA at LP of SB0. At operation 330, the scan manager 113 determines that the RBER for the codewords of WLA at LP of SB0 does not satisfy the RBER threshold such that the flow of operations continues to operation 335. At operation 335, the scan manager 113 determines that WLA (e.g., the first wordline) is not the last wordline (e.g., WLD) of the list of wordlines shown in Table 1 above. Accordingly, a next iteration of method 300 used to perform dynamic wordline, page, and sub-block selection during RDH processes is performed (e.g., the second iteration, as described above).

In some embodiments, operations 310-345 can be repeated for each block of a memory device during RDH.

Figure 4:
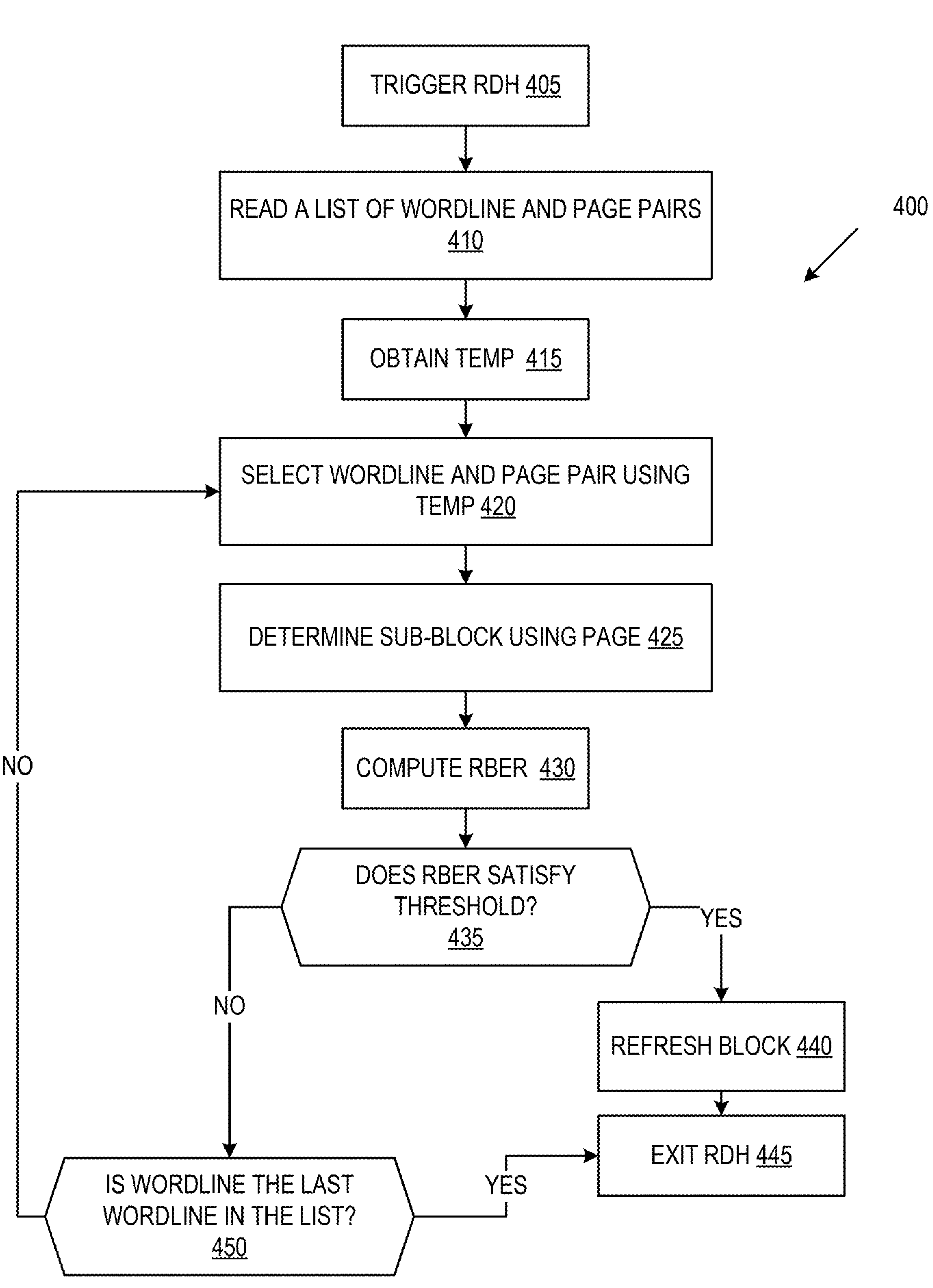
FIG. 4 is a flow diagram of an example method to perform temperature-dependent dynamic wordline, page, and-sub-block selection during read disturb handling processes, in accordance with some embodiments of the present disclosure.

FIG. 4 is a flow diagram of an example method 400 to perform temperature-dependent dynamic wordline, page, and-sub-block selection during RDH processes, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the scan manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Similar to the description above with reference to operation 205 of FIG. 2, the processing device triggers RDH at operation 405. For example, the scan manager 113 can determine that a number of read operations performed on pages, wordlines, or sub-blocks of a block of the memory device satisfies a read count threshold and/or a threshold amount of time has passed since the last RDH process. As described above with reference to operation 205 of FIG. 2, if the read command that triggered the RDH processes originates from the host system, a foreground RDH is triggered. As a result of the more stringent latency requirements associated with a foreground RDH, a single wordline, page, and sub-block is selected by the scan manager 113 at operations 420 and 425 respectively. If the read command that triggered the RDH processes originates from the memory subsystem 110, a background RDH is triggered. As a result, more than one wordline, page, and/or sub-block can be selected by the scan manager 113 at operation 420 and/or operation 425 respectively. For example, if the RDH is a background RDH, at operation 420, the scan manager 113 can select two wordline and page pairs to be scanned during the background RDH using a temperature value.

Similar to the description above with reference to operation 310 of FIG. 3, at operation 410, the processing device reads a list of worldline and page pairs. The list of wordline and page pairs maps pages to wordlines to be scanned. Similar to the description above with reference to operation 210 of FIG. 2, the scan manager 113 can modify the list of wordline and page pairs using the frequency of read commands. For example, the scan manager 113 can add or remove a number of wordline and page pairs from the list of wordline and page pairs responsive to the frequency of read commands. In some embodiments, the added or removed wordlines and corresponding pages are predetermined. For example, the added or removed wordlines and corresponding pages can be additional parameters that are based on the requirements of a particular design or implementation of the memory device or the computing system, for example as the result of experimentation or operational testing.

At operation 415, the processing device obtains a temperature value. For example, the scan manager 113 can receive a temperature value corresponding to the temperature of the memory subsystem 110 using any suitable mechanism.

At operation 420, the processing device selects a wordline and page pair using the temperature value. Different wordline and page pairs are impacted differently by the temperature. As a result, the set of wordline and page pairs can be grouped into subsets of wordlines and page pairs, where the subsets of wordline and page pairs used during RDH depend on the temperature value. For example, if the temperature value meets or exceeds a temperature threshold, the scan manager 113 uses a first subset of wordlines and page pairs during RDH. Accordingly, the scan manager 113 selects a first wordline and page pair from the first subset of wordlines and page pairs at operation 420. If the temperature value does not meet or exceed the temperature threshold, the scan manager 113 uses a second subset of wordlines and page pairs during RDH. Accordingly, the scan manager 113 selects a first wordline and page pair from the second subset of wordline and page pairs at operation 420.

In a non-limiting example, at lower temperatures (e.g., temperatures less than the temperature threshold), wordlines can exhibit an increased RBER on lower pages as opposed to extra pages. Accordingly, to optimize the efficiency of RDH processes, the scan manager 113 does not scan wordlines on extra pages at temperatures less than the temperature threshold. As a result, the scan manager 113 skips a first sub-subset of wordline and page pairs of the list of wordline and page pairs during RDH (e.g., the wordlines on extra pages can be omitted from the RDH process when the temperature value is less than the temperature threshold). Accordingly, the scan manager 113 scans a second subset of wordline and page pairs from the list of wordline and page pairs during RDH (e.g., the wordlines on lower pages and/or upper pages). Therefore, a first wordline and page pair from the second subset of wordline and page pairs is selected at operation 420.

In contrast, at higher temperatures (e.g., temperatures that meet or exceed the temperature threshold), wordlines can exhibit an increased RBER on extra pages as opposed to lower pages. Accordingly, to optimize the efficiency of RDH processes, the scan manager 113 does not scan wordlines on lower pages at temperatures higher than the temperature threshold. As a result, the scan manager 113 skips a first subset of wordline and page pairs from the list of wordline and page pairs during RDH (e.g., the wordlines on lower pages can be omitted from the RDH process when the temperature value meets or exceeds the temperature threshold). As a result, the scan manager 113 scans a second subset of wordline and page pairs from the list of wordline and page pairs during RDH. Therefore, a first wordline and page pair from the second subset of wordline and page pairs is selected at operation 420.

Operations 425-450 are similar to the description above with reference to operations 320-345 of FIG. 3. For example, at operation 425, the processing device determines a sub-block to be scanned using the page of the wordline and page pair. For example, the scan manager 113 randomly selects a sub-block from a set of sub-blocks corresponding to the page of the wordline and page pair. The set of sub-blocks that correspond to the page is determined using a sub-block dependence pattern.

At operation 430, the processing device computes the RBER of the wordline at the page of the selected sub-block. For example, the scan manager 113 can decode the codeword to identify the number of changed bits. At operation 435, the processing device determines whether the RBER satisfies an RBER threshold. If the RBER satisfies the RBER threshold (e.g., the RBER corresponding to the wordline of the page of the sub-block meets or exceeds the RBER threshold), the flow of operations moves to operation 440. If the RBER does not satisfy the RBER threshold (e.g., the RBER corresponding to the wordline of the page of the sub-block does not meet or exceed the RBER threshold), the flow of operations moves to operation 450. At operation 440, the processing device refreshes the block and at operation 445, the RDH process is complete. At operation 450, the processing device determines whether the scanned wordline is the last wordline in the list of wordlines (e.g., the wordline and page pair list). If the wordline is the last wordline, then the flow of operations moves to operation 445 and the RDH process is complete. If the wordline is not the last wordline (e.g., there are other wordlines in the wordline and page pair list to be scanned), then the flow of operations moves to operation 420 for the next iteration of method 400.

In some embodiments, operations 420-450 are repeated for each block of a memory device during RDH.

Figure 5:
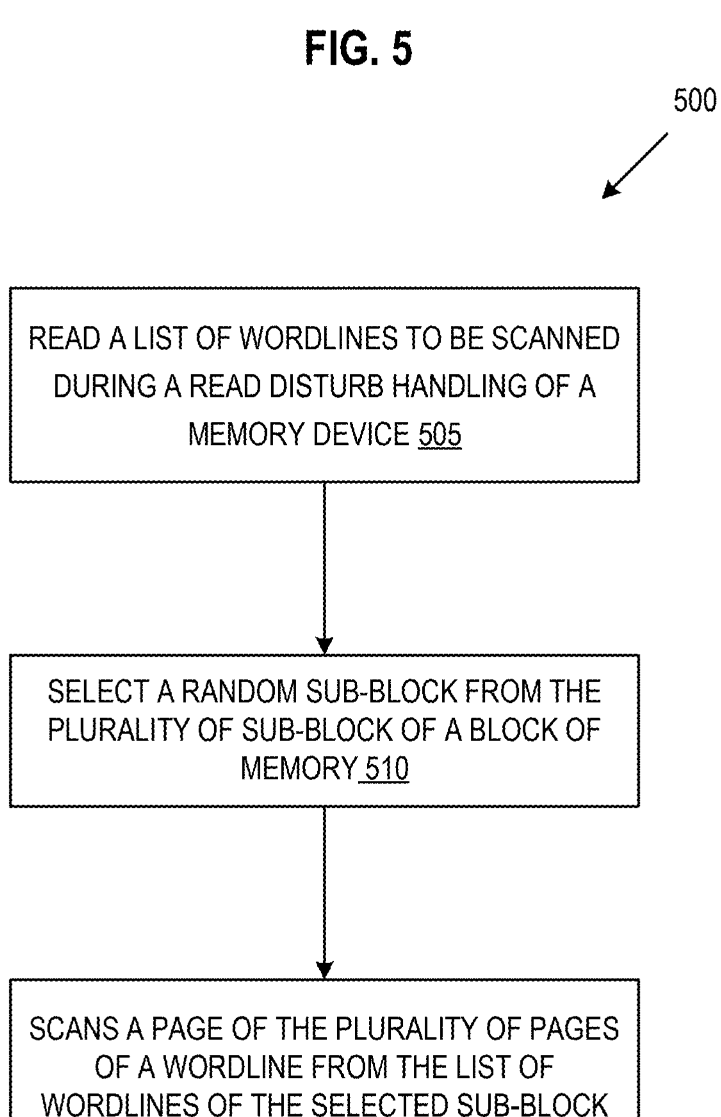
FIG. 5 is a flow diagram of an example method of selective scanning during read disturb handling in accordance with some embodiments of the present disclosure.

FIG. 5 is a flow diagram of an example method 500 of selective scanning during read disturb handling in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the scan manager 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, the processing device reads a list of wordlines to be scanned during a read disturb handling of a memory device. In some embodiments, the wordlines and the number of wordlines of the list of wordlines is predetermined. For example, both the wordlines and the number of wordlines in the list of wordlines can be parameters that are based on the requirements of a particular design or implementation of the memory device or the computing system, for example as the result of experimentation or operational testing. The memory device has separately accessible blocks of memory where each block of memory has a plurality of wordlines used to address a plurality of pages. Each block of memory is divided into a plurality of sub-blocks. As described above with reference to operation 210 of FIG. 2, the scan manager 113 can modify the list of wordline and page pairs using the frequency of read commands. For example, the scan manager 113 can add or remove wordlines from the list of wordlines responsive to the frequency of read commands. In some embodiments, the added or removed wordlines are predetermined. For example, the added or removed wordlines and corresponding pages can be additional parameters that are based on the requirements of a particular design or implementation of the memory device or the computing system, for example as the result of experimentation or operational testing. Additionally, in some embodiments, the scan manager 113 reads a list of wordlines from a list of wordline and page pairs as described above, for example, at operation 310 of FIG. 3 and/or operation 410 of FIG. 4.

At operation 510, the processing device randomly selects a sub-block from the plurality of sub-blocks of a block of memory. As described above with reference to operation 215 of FIG. 2, the scan manager 113 can generate a random integer between 0 and N−1, where N is the number of sub-blocks of a block and select the sub-block to be scanned according to the corresponding generated random integer. In some embodiments, the scan manager 113 selects the sub-block from a subset of sub-blocks as described above, for example, at operations 315 and 320 of FIG. 3 and/or operations 420 and 425 of FIG. 4.

At operation 515, the processing device scans a page of the plurality of pages of a wordline from the list of wordlines of the selected sub-block during the read disturb handling. Scanning the wordline includes reading one or more codewords from the wordline by applying a charge to the wordline.

Figure 6:
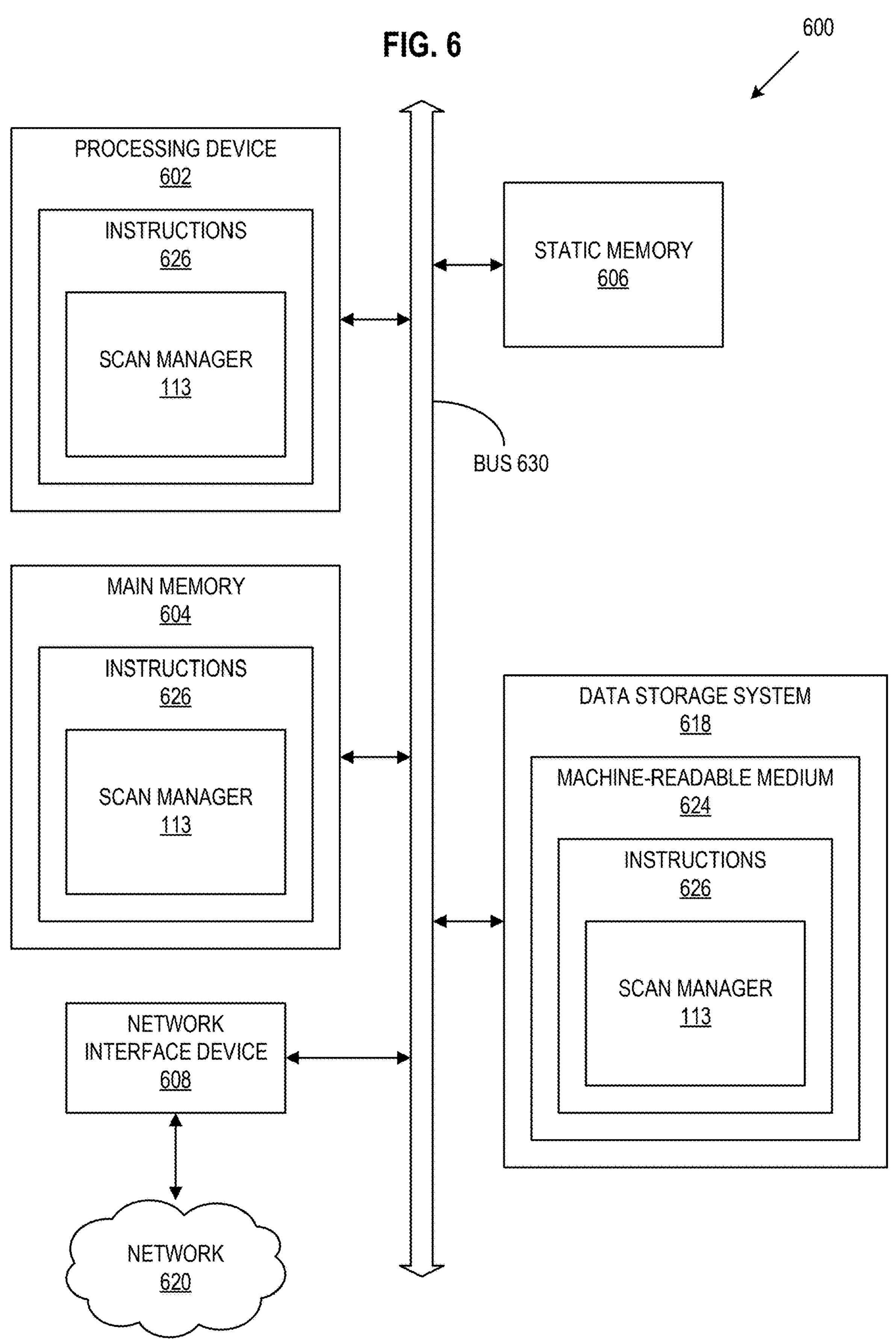
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the scan manager 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory subsystem 110 of FIG. 1.

In one embodiment, the instructions 626 include instructions to implement functionality corresponding to scan manager (e.g., the scan manager 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115 or the scan manager 113, may carry out the computer-implemented methods 200-500 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:

reading a list of wordlines to be scanned during a read disturb handling (RDH) of a memory device, the memory device having separately accessible blocks of memory, each block of memory having a plurality of wordlines used to address a plurality of pages and each block of memory divided into a plurality of sub-blocks;

randomly selecting a sub-block from the plurality of sub-blocks of a block of memory; and scanning a page of the plurality of pages of a wordline from the list of wordlines of the selected sub-block during the RDH.

2. The method of claim 1, further comprising:

obtaining a temperature value; and selecting the wordline of the list of wordlines to be scanned using the temperature value.

3. The method of claim 2, further comprising:

comparing the temperature value to a temperature threshold to select the wordline of the list of wordlines, wherein the wordline is selected from a subset of wordlines from the list of wordlines.

4. The method of claim 3, further comprising:

omitting a wordline from the list of wordlines responsive to the comparison of the temperature value to the temperature threshold.

5. The method of claim 1, wherein the list of wordlines includes wordlines and corresponding pages to be scanned during RDH, further comprising:

reading a wordline and page pair from the list of wordlines to be scanned during the RDH;

determining a subset of sub-blocks from a page of the wordline and page pair; and randomly selecting a sub-block from the subset of sub-blocks.

6. The method of claim 1, further comprising:

determining the RDH is a background operation; and selecting at least one of an additional wordline, an additional page, or an additional sub-block to be scanned during the RDH.

7. The method of claim 1, further comprising:

determining a frequency of read operations; and modifying the list of wordlines to be scanned during the RDH.

8. A non-transitory computer-readable storage medium comprising instructions that, when executed by a processing device, cause the processing device to:

read a list of wordlines to be scanned during a read disturb handling (RDH) of a memory device, the memory device having separately accessible blocks of memory, each block of memory having a plurality of wordlines used to address a plurality of pages and each block of memory divided into a plurality of sub-blocks;

randomly select a sub-block from the plurality of sub-blocks of a block of memory; and scan a page of the plurality of pages of a wordline from the list of wordlines of the selected sub-block during the RDH.

9. The non-transitory computer-readable storage medium of claim 8, wherein the processing device is further to:

obtain a temperature value; and select the wordline of the list of wordlines to be scanned using the temperature value.

10. The non-transitory computer-readable storage medium of claim 9, wherein the processing device is further to:

compare the temperature value to a temperature threshold to select the wordline of the list of wordlines, wherein the wordline is selected from a subset of wordlines from the list of wordlines.

11. The non-transitory computer-readable storage medium of claim 10, wherein the processing device is further to:

omit a wordline from the list of wordlines responsive to the comparison of the temperature value to the temperature threshold.

12. The non-transitory computer-readable storage medium of claim 8, wherein the list of wordlines includes wordlines and corresponding pages to be scanned during RDH, and wherein the processing device is further to:

read a wordline and page pair from the list of wordlines to be scanned during the RDH;

determine a subset of sub-blocks from a page of the wordline and page pair; and randomly select a sub-block from the subset of sub-blocks.

13. The non-transitory computer-readable storage medium of claim 8, wherein the processing device is further to:

determine the RDH is a background operation; and select at least one of an additional wordline, an additional page, or an additional sub-block to be scanned during the RDH.

14. The non-transitory computer-readable storage medium of claim 8, wherein the processing device is further to:

determine a frequency of read operations; and modify the list of wordlines to be scanned during the RDH.

15. A system comprising:

a plurality of memory devices; and a processing device, operatively coupled with the plurality of memory devices, to:

read a list of wordlines to be scanned during a read disturb handling (RDH) of a memory device, the memory device having separately accessible blocks of memory, each block of memory having a plurality of wordlines used to address a plurality of pages and each block of memory divided into a plurality of sub-blocks;

determine a frequency of read operations;

modify the list of wordlines to be scanned during the RDH;

randomly select a sub-block from the plurality of sub-blocks of a block of memory; and scan a page of the plurality of pages of a wordline from the list of wordlines of the selected sub-block during the RDH.

16. The system of claim 15, wherein the processing device is further to:

obtain a temperature value; and select the wordline of the list of wordlines to be scanned using the temperature value.

17. The system of claim 16, wherein the processing device is further to:

compare the temperature value to a temperature threshold to select the wordline of the list of wordlines, wherein the wordline is selected from a subset of wordlines from the list of wordlines.

18. The system of claim 17, wherein the processing device is further to:

omit a wordline from the list of wordlines responsive to the comparison of the temperature value to the temperature threshold.

19. The system of claim 15, wherein the list of wordlines includes wordlines and corresponding pages to be scanned during RDH, and wherein the processing device is further to:

read a wordline and page pair from the list of wordlines to be scanned during the RDH;

determine a subset of sub-blocks from a page of the wordline and page pair; and randomly select a sub-block from the subset of sub-blocks.

20. The system of claim 15, wherein the processing device is further to:

determine the RDH is a background operation; and select at least one of an additional wordline, an additional page, or an additional sub-block to be scanned during the RDH.

* * * * *